United States Patent
Cowles et al.

(10) Patent No.: US 10,446,248 B1
(45) Date of Patent: Oct. 15, 2019

(54) NON-VOLATILE MEMORY DEVICES AND SYSTEMS WITH READ-ONLY MEMORY FEATURES AND METHODS FOR OPERATING THE SAME

(71) Applicant: Micron Technology, Inc., Boise, ID (US)

(72) Inventors: Timothy B. Cowles, Boise, ID (US); George B. Raad, Boise, ID (US); James S. Rehmeyer, Boise, ID (US); Jonathan S. Parry, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/959,921

(22) Filed: Apr. 23, 2018

(51) Int. Cl.
| | | |
|---|---|---|
| G11C 17/08 | (2006.01) | |
| G11C 17/16 | (2006.01) | |
| G11C 17/18 | (2006.01) | |
| G11C 16/08 | (2006.01) | |
| G11C 16/22 | (2006.01) | |
| G11C 11/22 | (2006.01) | |
| G11C 13/00 | (2006.01) | |
| G11C 11/16 | (2006.01) | |

(52) U.S. Cl.
CPC .......... *G11C 17/08* (2013.01); *G11C 11/1653* (2013.01); *G11C 11/1695* (2013.01); *G11C 11/2253* (2013.01); *G11C 11/2295* (2013.01); *G11C 13/0004* (2013.01); *G11C 13/0023* (2013.01); *G11C 13/0059* (2013.01); *G11C 16/08* (2013.01); *G11C 16/22* (2013.01); *G11C 17/165* (2013.01); *G11C 17/18* (2013.01)

(58) Field of Classification Search
CPC . G11C 17/08; G11C 11/1653; G11C 11/1695; G11C 11/2253; G11C 11/2295; G11C 13/0004; G11C 13/0023; G11C 13/0059; G11C 16/08; G11C 16/22; G11C 17/165
USPC ...................................... 365/185.18
See application file for complete search history.

(56) References Cited

U.S. PATENT DOCUMENTS 8,120,949 B2 *  2/2012  Ranjan ................... G11C 11/15
                                                                  365/148

OTHER PUBLICATIONS

U.S. Appl. No. 15/959,868—Unpublished Patent Application by Timothy B. Cowles et al., titled "Non-Volatile Memory Devices and Systems With Volatile Memory Features and Methods for Operating the Same", filed Apr. 23, 2018, 18 pages.

* cited by examiner

*Primary Examiner* — Harry W Byrne
(74) *Attorney, Agent, or Firm* — Perkins Coie LLP

(57) ABSTRACT

Memory devices, systems including memory devices, and methods of operating memory devices and systems are provided, in which at least a subset of a non-volatile memory array is configured to behave as read-only memory by not implementing erase or write commands. In one embodiment of the present technology, a memory device is provided, comprising a non-volatile memory array, and circuitry configured to store one or more addresses of the non-volatile memory array, to compare an address of a received command to the one or more addresses, and at least in part based on the comparison, determine not to implement the received command. The circuitry can be further configured to return an error message after determining not to implement the received command.

12 Claims, 3 Drawing Sheets

NON-VOLATILE MEMORY DEVICES AND SYSTEMS WITH READ-ONLY MEMORY FEATURES AND METHODS FOR OPERATING THE SAME

RELATED APPLICATION(S)

This application contains subject matter related to an U.S. patent application by Timothy B. Cowles, Jonathan S. Parry, George B. Raad, and James S. Rehmeyer titled "NON-VOLATILE MEMORY DEVICES AND SYSTEMS WITH VOLATILE MEMORY FEATURES AND METHODS FOR OPERATING THE SAME". The related application is assigned to Micron Technology, Inc., and is identified as U.S. patent application Ser. No. 15/959,868, filed Apr. 23, 2018. The subject matter thereof is incorporated herein by reference thereto.

TECHNICAL FIELD

The present disclosure generally relates to semiconductor memory devices, and more particularly relates to non-volatile memory devices and systems with read-only memory features and methods for operating the same.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including random-access memory (RAM), static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), ferroelectric random access memory (FeRAM), resistive random access memory (RRAM), and magnetic random access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

DETAILED DESCRIPTION

Non-volatile memory devices are frequently used for the storage of data, due to the persistence thereof in the absence of applied power. With recent advances in non-volatile memory technologies improving the speed and cost of non-volatile memory, non-volatile memory devices are increasingly being used in applications other than storage. For example, as non-volatile memory devices improve to the point that they can provide similar speed and/or endurance as volatile memory devices, they may increasingly be used in place of volatile memory devices to provide caches, primary memories, or to fill other traditional volatile memory applications.

Although the property by which non-volatile memory devices can erase and change the data stored thereon is usually considered a benefit of non-volatile memory technologies, there are circumstances and use cases in which the rewritability of non-volatile memory devices may be disadvantageous. For example, for some types of information such as transaction logs, unique identifiers, or the like it may be desirable to ensure persistent storage (e.g., prohibiting the erasing or overwriting thereof). Some memory systems may implement host-managed approaches to preventing data from being erased or overwritten (e.g., changed), but these approaches can be bypassed by powering down the host system and removing the non-volatile memory device storing the sensitive data in order to erase or change it with a different host device.

Accordingly, several embodiments of the present technology are directed to memory devices, systems including memory devices, and methods of operating memory devices and systems in which at least a subset of a non-volatile memory array is configured to behave as a read-only memory by determining not to implement an erase or write command received from a host device. In one embodiment of the present technology, a memory device is provided, comprising a non-volatile memory array, and circuitry configured to store one or more addresses of the non-volatile memory array, to compare an address of a received command to the one or more addresses, and at least in part based on the comparison, determine not to implement the received command. The circuitry can be further configured to return an error message after determining not to implement the received command.

Figure 1:
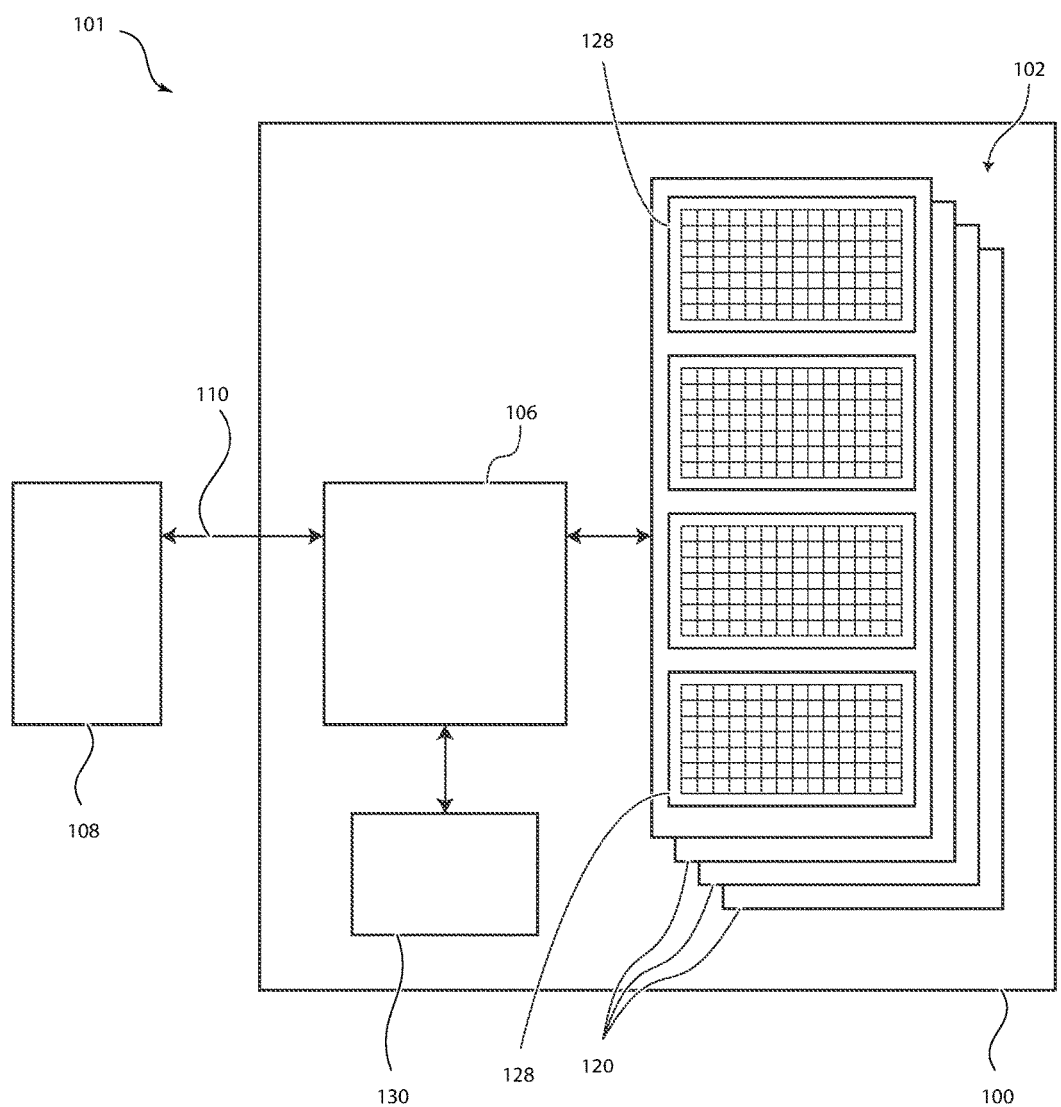
FIG. 1 is a block diagram schematically illustrating a memory device in accordance with an embodiment of the present technology.

FIG. 1 is a block diagram of a system 101 having a memory device 100 configured in accordance with an embodiment of the present technology. As shown, the memory device 100 includes a main memory 102 (e.g., DRAM, NAND flash, NOR flash, FeRAM, PCM, etc.) and control circuitry 106 operably coupled to a host device 108 (e.g., an upstream central processor (CPU)). The main memory 102 includes a plurality of memory regions, or memory units 120, which each include a plurality of memory cells. The memory units 120 can be individual memory dies, memory planes in a single memory die, a stack of memory dies vertically connected with through-silicon vias (TSVs), or the like. For example, in one embodiment, each of the memory units 120 can be formed from a semiconductor die and arranged with other memory unit dies in a single device package (not shown). In other embodiments, multiple memory units 120 can be co-located on a single die and/or distributed across multiple device packages. The memory units 120 may, in some embodiments, also be sub-divided into memory regions 128 (e.g., banks, ranks, channels, blocks, pages, etc.).

The memory cells can include, for example, floating gate, charge trap, phase change, capacitive, ferroelectric, magnetoresistive, and/or other suitable storage elements configured to store data persistently or semi-persistently. The main memory 102 and/or the individual memory units 120 can also include other circuit components (not shown), such as multiplexers, decoders, buffers, read/write drivers, address registers, data out/data in registers, etc., for accessing and/or programming (e.g., writing) the memory cells and other functionality, such as for processing information and/or communicating with the control circuitry 106 or the host device 108. The memory cells can be arranged in rows (e.g., each corresponding to a word line) and columns (e.g., each corresponding to a bit line). In other embodiments, the memory cells can be arranged in different types of hierarchies and/or groups than those shown in the illustrated embodiments. Further, although shown in the illustrated embodiments with a certain number of memory cells, rows, columns, blocks, and memory units for purposes of illustration, the number of memory cells, rows, columns, regions, and memory units can vary, and can, in other embodiments, be larger or smaller in scale than shown in the illustrated examples. For example, in some embodiments, the memory device 100 can include only one memory unit 120. Alternatively, the memory device 100 can include two, three, four, eight, ten, or more (e.g., 16, 32, 64, or more) memory units 120. Although the memory units 120 are shown in FIG. 1 as including two memory regions 128 each, in other embodiments, each memory unit 120 can include one, three, four, eight, or more (e.g., 16, 32, 64, 100, 128, 256 or more) memory regions.

In one embodiment, the control circuitry 106 can be provided on the same die as the main memory 102 (e.g., including command/address/clock input circuitry, decoders, voltage and timing generators, input/output circuitry, etc.). In another embodiment, the control circuitry 106 can be a microcontroller, special purpose logic circuitry (e.g., a field programmable gate array (FPGA), an application specific integrated circuit (ASIC), control circuitry on a memory die, etc.), or other suitable processor. In one embodiment, the control circuitry 106 can include a processor configured to execute instructions stored in memory to perform various processes, logic flows, and routines for controlling operation of the memory device 100, including managing the main memory 102 and handling communications between the memory device 100 and the host device 108. In some embodiments, the control circuitry 106 can included embedded memory for storing, e.g., memory pointers, fetched data, etc. In another embodiment of the present technology, a memory device may not include control circuitry, and may instead rely upon external control (e.g., provided by the host device 108, or by a processor or controller separate from the memory device).

In operation, the control circuitry 106 can directly write or otherwise program (e.g., erase) the various memory regions of the main memory 102. The control circuitry 106 communicates with the host device 108 over a host-device bus or interface 110. In some embodiments, the host device 108 and the control circuitry 106 can communicate over a dedicated memory bus (e.g., a DRAM bus). In other embodiments, the host device 108 and the control circuitry 106 can communicate over a serial interface, such as a serial attached SCSI (SAS), a serial AT attachment (SATA) interface, a peripheral component interconnect express (PCIe), or other suitable interface (e.g., a parallel interface). The host device 108 can send various requests (in the form of, e.g., a packet or stream of packets) to the control circuitry 106. A request can include a command to read, write, erase, return information, and/or to perform a particular operation (e.g., a TRIM operation, a precharge operation, an activate operation, a wear-leveling operation, a garbage collection operation, etc.).

The host device 108 can be any one of a number of electronic devices capable of utilizing memory for the temporary or persistent storage of information, or a component thereof. For example, the host device 108 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device 108 may be a networking device (e.g., a switch, a router, etc.) or a recorder of digital images, audio and/or video, a vehicle, an appliance, a toy, or any one of a number of other products. In one embodiment, the host device 108 may be connected directly to memory device 100, although in other embodiments, the host device 108 may be indirectly connected to memory device (e.g., over a networked connection or through intermediary devices).

In some embodiments, the control circuitry 106 can configure a subset of the main memory 102 to behave as a read-only memory (ROM) (e.g., a write-once, read-many (WORM) memory), in which the data can be stored persistently and be protected from erasure or change. In this regard, the control circuitry 106 can be configured to store (e.g., in the main memory 102, in an embedded memory of the control circuitry 106, in a separate dedicated memory, etc.) one or more addresses (e.g., corresponding to cells, rows, columns, pages, etc.) of the main memory 102 that are configured to behave in a read-only manner. The controller can store the one or more addresses in response to a command received at the memory device 100 (e.g., from the host device 108). Alternatively, the one or more addresses can be stored at the time of manufacture or initial setup of the memory device 100.

According to an aspect of the present technology, the control circuitry 106 can be further configured to compare an address of a received erase or write command (e.g., received from the host device 108) to the stored one or more addresses to determine whether or not the received command should be implemented. For example, in an embodiment in which the stored one or more addresses of memory are configured to behave in a read-only manner, a determination that the received command is directed to an address corresponding to the stored one or more addresses can result in the control circuitry 106 determining not to implement the command. In some embodiments, the control circuitry 106 can be configured instead to return an error message (e.g., indicating to the host device 108 that the received command has not been implemented).

In some embodiments, in which a large subset of the memory device is configured to behave in a read-only manner, the stored one or more addresses may correspond to the portion of the main memory 102 not configured to behave in a read-only manner. In such an embodiment, a determination that the received command is directed to an address not corresponding to the stored one or more addresses can result in the control circuitry 106 determining not to implement the command.

For added security, in some embodiments of the present technology, the one or more addresses of the non-volatile main memory 102 to be erased or degraded upon detecting a changed power condition can be stored in a WORM memory 140, such as an array of fuses or anti-fuses. By writing the one or more addresses to a memory location which is subsequently unmodifiable, the security provided by preventing the data at the one or more addresses from being erased or changed can be better assured (e.g., a malicious actor will be unable to alter the read-only behavior of the one or more addresses by overwriting, removing or otherwise modifying the stored addresses in the WORM memory 140).

Figure 2:
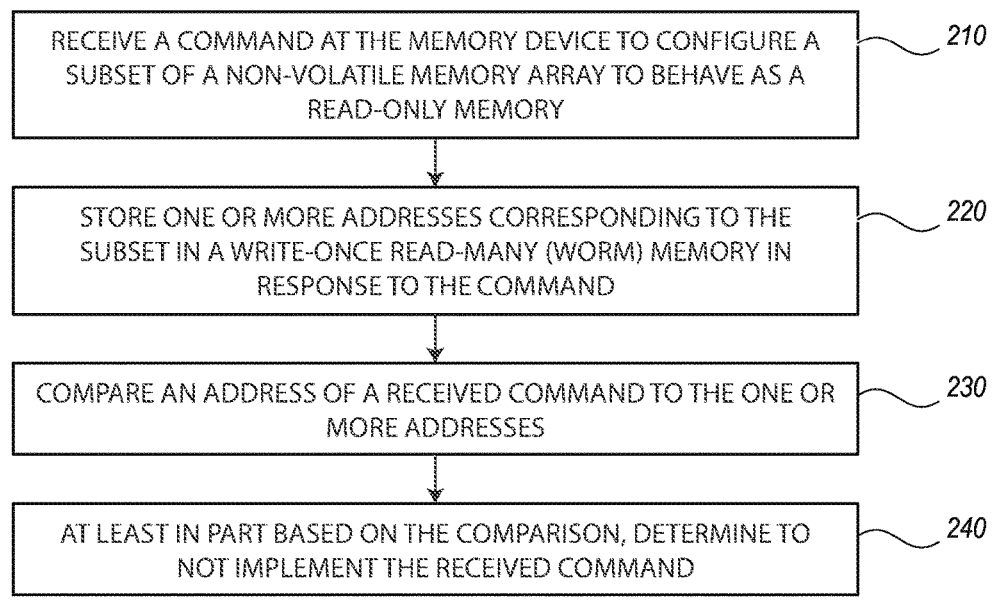
FIG. 2 is a flow chart illustrating a method of operating a memory device in accordance with an embodiment of the present technology.

FIG. 2 is a flow chart illustrating a method of operating a memory device in accordance with an embodiment of the present technology. The method includes receiving a command at the memory device to configure a subset of a non-volatile memory array to behave as a read-only memory (box 210) and storing one or more addresses corresponding to the subset in response to the command (box 220). In accordance with one aspect of the present technology, the one or more addresses can be stored in a write-once, read-many (WORM) memory of the memory device. In accordance with another aspect, however, the one or more addresses can be stored in a main memory of the memory device, an embedded memory of a controller thereof, or in a dedicated memory that is rewritable. The method further includes comparing an address of a received command to the one or more addresses (box 230) and, based at least in part on the comparison, determining not to implement the received command (box 240). In accordance with one aspect of the present technology, the received command can be a write command or an erase command.

Figure 3:
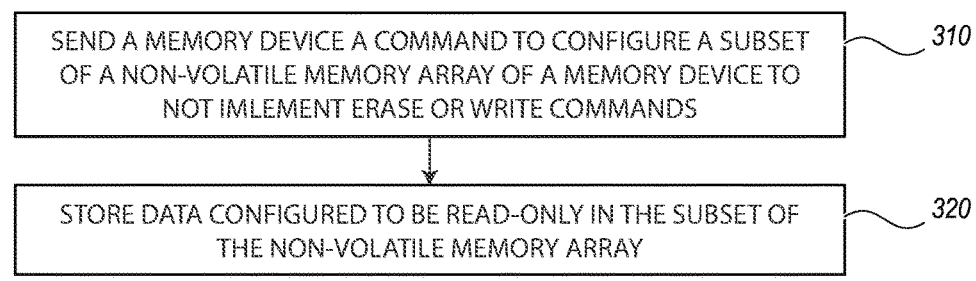
FIG. 3 is a flow chart illustrating a method of operating a memory device in accordance with an embodiment of the present technology.

FIG. 3 is a flow chart illustrating a method of operating a memory device in accordance with an embodiment of the present technology. The method includes sending a command to the memory device to configure a subset of a non-volatile memory array to behave as a read-only memory (e.g., to not implement write or erase commands corresponding to the subset) (box 310). The method further includes storing data configured to be read-only at the one or more addresses corresponding to the subset (box 320).

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A memory device, comprising:
a non-volatile memory array; and
circuitry configured to:
   store one or more addresses of the non-volatile memory array;
   compare an address of a received command to the one or more addresses; and
   at least in part based on the comparison, determine not to implement the received command.

2. The memory device of claim 1, wherein the received command is a write command or an erase command.

3. The memory device of claim 1, wherein the circuitry is configured to store the one or more addresses in a write-once read-many (WORM) memory of the memory device.

4. The memory device of claim 3, wherein the circuitry is further configured to:
write the one or more addresses to the write-once read-many (WORM) memory in response to a command received at the memory device.

5. The memory device of claim 3, wherein the write-once read-many (WORM) memory comprises an array of fuses, anti-fuses, or a combination thereof.

6. The memory device of claim 1, wherein the circuitry is configured to store the one or more addresses in a mode register of the memory device.

7. The memory device of claim 1, wherein the circuitry is configured to determine not to implement the received command in response to the received command corresponding to the one or more addresses.

8. The memory device of claim 1, wherein the circuitry is configured to determine not to implement the received command in response to the received command not corresponding to the one or more addresses.

9. The memory device of claim 1, wherein the circuitry is further configured to return an error message after determining not to implement the received command.

10. The memory device of claim 1, wherein the non-volatile memory array comprises NAND flash, NOR flash, MRAM, FeRAM, PCM, or a combination thereof.

11. The memory device of claim 1, wherein a single semiconductor die comprises the non-volatile memory array and the circuitry.

12. The memory device of claim 1, wherein a memory controller die comprises the circuitry and a memory die comprises the non-volatile memory array.

* * * * *